Oct. 21, 1969 E. D. COHEN 3,474,348

MICROWAVE AMPLIFIER SYSTEM WITH OVERALL FEEDBACK

Filed March 2, 1967 2 Sheets-Sheet 1

INVENTOR
ELIOT D. COHEN

BY James B. Murray
R. Ciacco ATTORNEYS

MICROWAVE AMPLIFIER SYSTEM WITH OVERALL FEEDBACK

Filed March 2, 1967 2 Sheets-Sheet 2

INVENTOR
ELIOT D. COHEN

BY James G. Murray
[signature]
ATTORNEYS

United States Patent Office 3,474,348

Patented Oct. 21, 1969

3,474,348

MICROWAVE AMPLIFIER SYSTEM WITH OVERALL FEEDBACK

Eliot D. Cohen, Silver Spring, Md., assignor to the United States of America as represented by the Secretary of the Navy Filed Mar. 2, 1967, Ser. No. 621,099

Int. Cl. H03f 3/60

U.S. Cl. 330—53 5 Claims

ABSTRACT OF THE DISCLOSURE

A microwave amplifier system having a plurality of cascaded, circulator coupled, tunnel diode stages with overall negative feedback for operation at frequencies of 1000 mHz. and above.

The invention described herein may be manufactured and used by or for the Government of the United States of America for governmental purposes without the payment of any royalties thereon or therefor.

BACKGROUND OF THE INVENTION

Field of the invention

The present invention relates to microwave amplifier systems and more particularly to a coaxial or waveguide system wherein a plurality of cascaded, circulator coupled, tunnel diode stages are operated with overall negative feedback at frequencies of 1000 mHz. and above.

Description of the prior art

It has long been well known in the prior art to use negative feedback with many stages of amplification in lumped parameter (lower frequency) amplifier circuits. Such use of negative feedback has produced the desirable results of stabilizing gain and phase shift over a widened frequency band.

The use of negative feedback with microwave amplifiers has been limited in the prior art, particularly with devices such as tunnel diodes wherein large changes of phase shift accompany rather small changes in the operating frequency. Such phase shifts, for small frequency changes, cause the feedback to become positive with accompanying undesired signal distortion due to oscillation in the amplifying circuit. Prior art tunnel diode amplifiers therefore have, in general, not used negative feedback.

SUMMARY OF THE INVENTION

The general purpose of this invention is to include overall negative feedback (and its advantages) into a multi-stage tunnel diode amplifier system capable of operating at frequencies of 1000 mHz. and above without introducing the undesirable (oscillation caused) distortions which frequently occur in other, prior art, high frequency diode amplifier systems. To attain this the present invention contemplates using a plurality of cascaded, circulator coupled, tunnel diode stages with overall negative feedback which is limited in magnitude to 5% (or less).

It is, therefore, an object of the present invention to provide a microwave amplifier system having a plurality of cascaded, circulator coupled, tunnel diode stages with overall negative feedback.

Another object is to provide a microwave amplifier system having a plurality of cascaded, circulator coupled, tunnel diode stages with overall negative feedback.

Another object is to provide a microwave amplifier system having a plurality of cascaded, circulator coupled, tunnel diode stages with overall negative feedback which is capable of operating at frequencies of 1000 mHz. and above.

A still further object of the invention is the provision of a microwave amplifier system which is capable of operating at frequencies of 1000 mHz. and above and which includes a plurality of cascaded, circulator coupled, tunnel diode stages and overall negative feedback which is limited to 5% or less.

BRIEF DESCRIPTION OF THE DRAWING

With the above and other objects in view, as will hereinafter more fully appear, and which will be more particularly pointed out in the appended claims, reference is now made to the following description taken in connection with the accompanying drawings in which:

DESCRIPTION OF THE INVENTION

Figure 1:
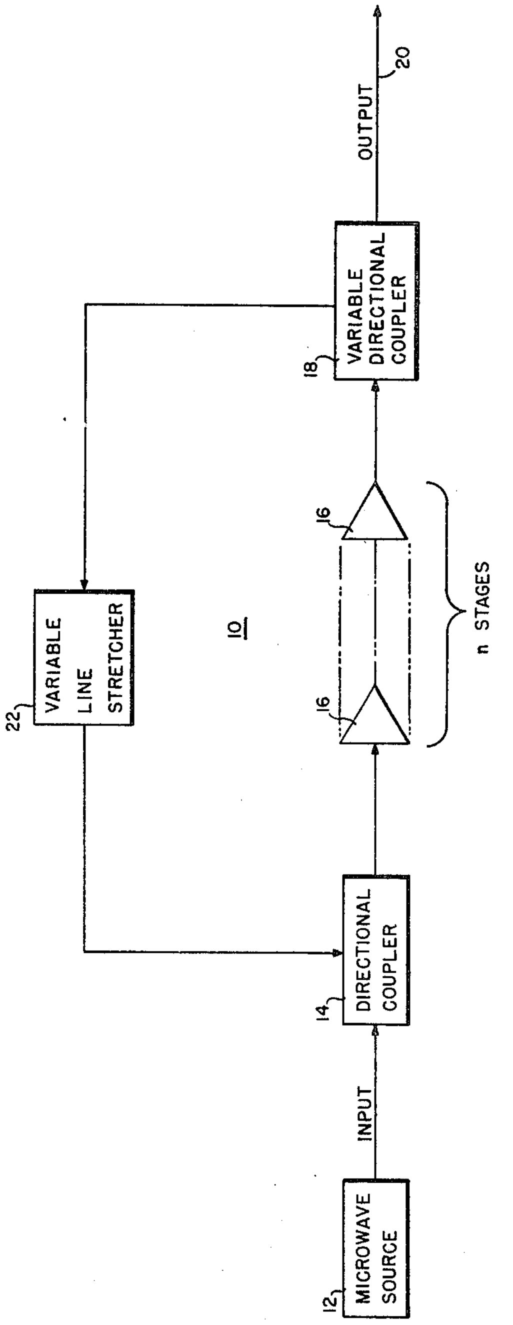
FIG. 1 illustrates the invention in block diagram form.

Referring now to the drawings, there is shown in FIG. 1 an amplifying system 10 wherein the various components are connected either by coaxial or waveguide transmission lines and wherein the customary impedance matching should be presumed. A source of microwave energy 12, which may be of a frequency in excess of 1000 mHz., is connected through directional coupler 14 to a plurality of ($n$) cascade connected amplifiers 16. The output of the last amplifier stage is connected to a variable directional coupler 18 which divides the energy, according to a preselected and variable proportioning, between the output transmission line 20 and the variable line stretcher 22 which is connected in a feedback loop back to the coupler 14.

The couplers 14 and 18 may be any of the many suitable, commercially available and widely known devices variously known as wave combiners, wave dividers, junctions, "rat races," etc. Coupler 14 must, of course, be capable of combining the energy from source 12 and line stretcher 22 (while isolating these components from each other). Coupler 18 need merely, as previously described, divide the energy from the amplifiers 16 between the output 20 and the component 22. Variable line stretcher 22 must be capable only of varying the phase of the feedback signal and can be any one of the many suitable, commercially available, devices which are well known as adjustable phase shifters, delays, line stretchers, etc.

Figure 2:
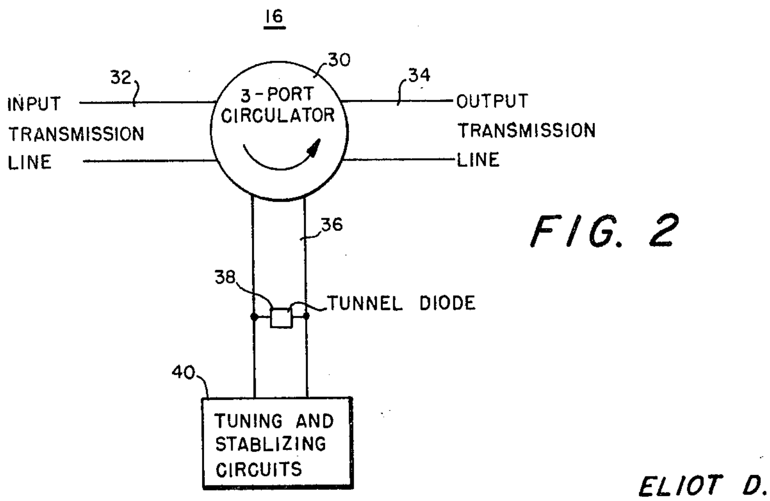
FIG. 2 diagrammatically shows one of the circulator coupled, tunnel diode stages of the invention.

FIG. 2 shows, in more detail, one of the amplifier stages 16. The three ports of circulator 30 are connected to an input transmission line 32, an output transmission line 34 and to a uniform transmission line 36 in which is located a tunnel diode 38 that is biased in its negative resistance region. Line 36 is terminated with tuning and stabilizing circuitry which suppresses, to some extent, oscillations which may occur as the result of changes in the operating frequency.

Inasmuch as circulator coupled, tunnel diode amplifiers are known and do not constitute, per se, the present invention, further theoretical and operational description of the amplifier 16 is not included herein but can be found in many publications, such as an article "A Microwave Tunnel Diode Amplifier" by Robert D. Gallagher which appeared in pages 62–68 of Microwave Journal, vol. 8, No. 2 (February, 1965).

Figure 3:
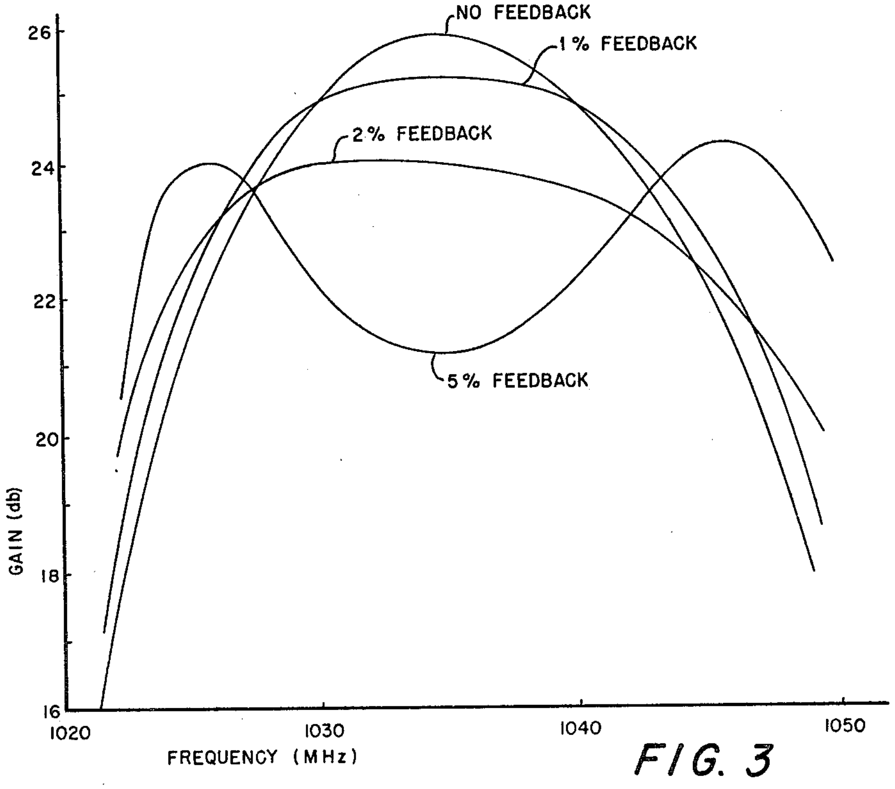
FIG. 3 is a graph illustrating the operational effect on a typical embodiment of the invention of varying magnitudes of overall negative feedback.

FIG. 3 is representative of the operational characteristics of a typical embodiment of the invention having two stages of amplification 16. With no feedback the system provides a gain of 26 db but with a rather limited (3 db down) bandwidth centered at 1034 mHz. The bandwidth is considerably widened, with only a slight diminution of maximum gain, for 1% and 2% negative feedback. For 5% negative feedback the frequency response curve is peaked at 1026 and 1046 mHz., showing the beginning of oscillation. For a negative feedback of 20% the system oscillates at all frequencies in the region plotted in FIG. 3.

To summarize the operation of the invention, high frequency energy from source 12 is combined with the negative feedback energy in coupler 14. The combined energy is amplified by *n* cascade connected amplifiers 16 and then divided by coupler 18, the major portion of the amplified energy being used as the output signal. A small fraction (less than 5%) of the energy received by coupler 18 is passed through variable device 22 which is used to adjust the phase of the feedback signal to be 180° out of phase with the energy from source 12. As shown in FIG. 3, the limited use of negative feedback causes the invention to have an improved (flatter) frequency response curve over an increased bandwidth with only a minimal reduction in maximum gain.

It will be apparent that there has been disclosed an amplifier system which is capable of operating at frequencies of 1000 mHz. and above and which includes a plurality of cascaded, circulator coupled, tunnel diode stages and overall negative feedback which is limited to 5% or less of the system output. Obviously many modifications and variations of the present invention are possible in the light of the above teachings.

What is claimed and desired to be secured by Letters Patent of the United States is:

1. An amplifier system comprising:
- a microwave source producing energy at a frequency of at least 1000 mHz.;
- a directional coupler having an input connected by energy transmission means to said microwave source;
- a plurality of cascade connected, circulator coupled, tunnel diode amplifier stages connected by energy transmission means to the output of said directional coupler;
- a variable directional coupler connected by energy transmission means to said plurality of amplifier stages; and
- feedback means, including a variable phase shifting device, connected between an output of said variable directional coupler and another input of said directional coupler.

2. An amplifier system as set forth in claim 1 wherein each of said plurality of cascade connected, circulator coupled, tunnel diode amplifier stages comprises:
- a three-port circulator;
- a uniform transmission line connected to one of the ports of said circulator;
- tuning and stabilizing circuits connected at the end of said uniform transmission line, and
- a tunnel diode connected in the interior of said uniform transmission line.

3. An amplifier system primarily useful with energy sources of 1000 mHz. and above comprising:
- directional coupler means having a first input for connection with said energy source, a second input and an output, said directional coupler means functioning to combine energy received at said first and second inputs;
- a plurality, including a first and last, of cascade connected, circulator coupled, tunnel diode amplifier stages, said first stage being connected by energy transmission means to said directional coupler means output;
- variable directional coupler means connected by energy transmission means to said last tunnel diode amplifier stage and having first and second outputs, said variable directional coupler means functioning to divide energy received from said last tunnel diode amplifier stage between said first and second outputs according to a variable preselected proportioning, and
- variable phase shifting means connected by energy transmission means to the output of said variable directional coupler means receiving the smaller portion of said divided energy and to the second input of said directional coupler means for shifting the phase of said smaller portion of divided energy to be 180° out of phase with the energy received at said first input of said directional coupler means.

4. An amplifier system as set forth in claim 3 wherein said smaller portion of energy is 5% or less of the energy received from said last tunnel diode amplifier stage.

5. An amplifier system as set forth in claim 4 wherein each of said plurality of cascade connected, circulator coupled, tunnel diode amplifier stages comprises:
- a three-port circulator;
- a uniform transmission line connected to one of the ports of said circulator;
- tuning and stabilizing circuits connected at the end of said uniform transmission line, and
- a tunnel diode connected in the interior of said uniform transmission line.

References Cited

UNITED STATES PATENTS

| | | | |
|---|---|---|---|
| 2,770,722 | 11/1956 | Arams | 330—107 X |
| 2,787,673 | 4/1957 | Cutler | 330—107 X |
| 3,021,490 | 2/1962 | Krompfner | 330—53 |
| 3,066,264 | 11/1962 | Goetter | 330—107 |

NATHAN KAUFMAN, Primary Examiner

U.S. Cl. X.R.

307—322; 330—61